United States Patent
Kamiya et al.

(10) Patent No.: US 6,314,046 B1
(45) Date of Patent: Nov. 6, 2001

(54) DUAL MEMORY CONTROL CIRCUIT

(75) Inventors: Tomonori Kamiya, Ogaki; Fumiaki Nagao, Gifu-ken, both of (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 09/535,604

(22) Filed: Mar. 27, 2000

(30) Foreign Application Priority Data

Mar. 30, 1999 (JP) .................................................. 11-089260

(51) Int. Cl.$^7$ ....................................................... G11C 8/00
(52) U.S. Cl. ...................... 365/230.04; 365/194; 365/239
(58) Field of Search .......................... 365/189.11, 189.12, 365/230.01, 230.04, 236, 239, 194

(56) References Cited

U.S. PATENT DOCUMENTS

| | | | |
|---|---|---|---|
| 4,709,264 | * 11/1987 | Tamura et al. ......................... | 358/479 |
| 5,036,494 | * 7/1991 | Wise et al. ........................ | 365/230.03 |
| 5,453,957 | * 9/1995 | Norris et al. ...................... | 365/230.04 |
| 5,787,047 | * 7/1998 | Norris et al. ...................... | 265/230.04 |
| 5,881,009 | * 3/1999 | Tomita ................................. | 365/221 |

* cited by examiner

Primary Examiner—David Nelms
Assistant Examiner—Gene N. Auduong
(74) Attorney, Agent, or Firm—Fish & Richardson P.C.

(57) ABSTRACT

A memory control circuit for writing or reading digital data at a high speed without increasing access speed to the memory circuit. The memory control circuit includes a control signal generation circuit for generating a first write enable signal and a first read enable signal of a first memory circuit, an address generation circuit for generating an address signal designating a data write address of the first memory circuit and a second memory circuit, and a write data supply circuit for supplying write data to the first and second memory circuits. A shift circuit is connected between the control signal generation circuit and the second memory circuit to generate a second write enable signal and a second read enable signal by shifting the first write enable signal and the first read enable signal by one cycle of a data write cycle or read cycle. The write data is written alternately to the first and second memory circuits in response to the first and second write enable signals. The data written to the first and second memory circuits is read alternately from the first and second memory circuits in response to the first and second read enable signals.

6 Claims, 4 Drawing Sheets

DUAL MEMORY CONTROL CIRCUIT

BACKGROUND OF THE INVENTION

The present invention relates to a memory control circuit, and more particularly, to a memory control circuit for controlling the writing and reading of data to or from a memory circuit.

When digital data undergoes an error correction process or an encoding/decoding process, various computation processes are performed on the digital data in block units. At this time, one block of digital data is stored in a buffer memory for a predetermined period to perform the computation process.

FIG. 1 is a schematic block diagram of a memory control circuit 100.

A memory circuit 10 has a capacity enabling storage of at least one block of data that undergoes the computation process. The memory circuit 10 stores write data DIN provided from the memory control circuit 100 and reads the stored data. Read data DOUT is sequentially output from the memory circuit 10. The memory circuit 10 is a synchronous memory which writes and reads data in accordance with a timing clock CK.

The memory control circuit 100 includes a control signal generation circuit 1, an address generation circuit 2, and a write data supply circuit 3. In response to a data write command or a data read command provided by a microprocessor, the control signal generation circuit 1 generates a write enable signal WE, which permits a write operation to be performed in the memory circuit 10, and a read enable signal RE, which permits a read operation to be performed. The control signal generation circuit 1 also generates a timing clock CK, which determines the operational timing of the memory circuit 10. In response to an address command provided from the microprocessor together with the data write/read command, the address generation circuit 2 generates an address AD for the memory circuit 10 and provides the address AD to the memory circuit 10. The write data supply circuit 3 receives data and holds the data. The held data is provided to the memory circuit 10 as the write data DIN.

The control signal generation circuit 1 generates the write enable signal WE, the read enable signal RE, and the timing clock CK in accordance with a reference clock BCK. During the write operation, the write data supply circuit 3 provides the write data DIN to the memory circuit 10 in accordance with the reference clock BCK. The address generation circuit 2 provides the write address AD of the data DIN, at the same time as the write enable signal WE, to the memory circuit 10 in accordance with the reference clock BCK. During the read operation, the address generation circuit 2 provides the read address AD, at the same time as the read enable signal RE, to the memory circuit 10.

FIG. 2 is a timing chart illustrating the write operation performed for two consecutive data.

Write data D(n) is first held by the write data supply circuit 3 in response to the rising of the reference clock BCK. The write data D(n) is provided to the memory circuit 10 during one cycle of the reference clock BCK. Synchronously with the holding of the data D(n), the write enable signal WE rises in accordance with the write command, and a p address of the memory circuit 10 is designated by the address AD. The data D(n) is written to the p address of the memory circuit 10 in response to the rising of the timing clock CK. Data D(n+1) provided subsequent to the data D(n) is also written to the memory circuit 10 in the same manner as described above. At this time, the address AD is changed from the p address to a q address at a timing in which the write data D(n) is switched to the data D(n+1).

FIG. 3 is a timing chart illustrating the read operation of the data stored in the memory circuit 10.

In accordance with the read command, the control signal generation circuit 1 causes the read enable signal RE to rise in response to the rising of the reference clock BCK and provides an address AD designating the p address to the memory circuit 10. When the timing clock CK rises in this state, the data D(n) stored at the p address of the memory circuit 10 is read and read data DOUT is output from the memory circuit 10. In response to the next rising edge of the reference clock BCK, the timing clock CK falls, and then the address AD is changed from the p address to the q address. In this state, when the timing clock CK rises again, the data D(n+1) stored at the q address of the memory circuit 10 is read and the read data DOUT is output from the memory circuit 10.

The memory circuit 10 has the writing or reading of data repeated in cycles in accordance with the reference clock BCK. A shorter operation cycle of the memory circuit 10 is effective for increasing the speed for processing digital data. However, the operation cycle is limited within a range in which access to the memory circuit 10 is allowed.

The time required for the computation process of the digital data is determined by the access speed of the memory circuit 10, which temporarily stores the digital data during the computation process. The access speed of the memory circuit 10 is determined by delays resulting from the circuit configuration in the memory circuit 10. Thus, when the storage capacity of the memory circuit 10 is expanded and the circuit area is increased, an increase in the access speed becomes difficult. Accordingly, as the digital data increases, it becomes difficult to decrease the processing time.

SUMMARY OF THE INVENTION

It is an object of the present invention to provide a memory control circuit that writes and reads digital data at a high speed without increasing the memory circuit access speed.

A first aspect of the present invention provides a memory control circuit for controlling writing and reading consecutive data to and from first and second memory circuits. The memory control circuit includes a control signal generation circuit for generating a first write enable signal and a first read enable signal of the first memory circuit, an address generation circuit for generating an address signal designating a data write address of the first and second memory circuits, and a write data supply circuit for supplying write data to the first and second memory circuits. A shift circuit is connected between the control signal generation circuit and the second memory circuit to generate a second write enable signal and a second read enable signal by shifting the first write enable signal and the first read enable signal by one cycle of a data write cycle or read cycle. The write data is written alternately to the first and second memory circuits in accordance with an address signal and in response to the first and second write enable signals. The data written to the first and second memory circuits is read alternately from the first and second memory circuits in response to the first and second read enable signals.

A second aspect of the present invention provides a method for controlling writing and reading consecutive data to and from first and second memory circuits. A first write enable signal and a first read enable signal of the first memory circuit is first generated. An address signal which designates a data write address of the first and second memory circuits is then generated. Then, a second write enable signal and a second read enable signal are generated by shifting the first write enable signal and the first read enable signal by one cycle of a data write cycle or read cycle. The first and second memory circuits alternately write data in accordance with an address signal and in response to the first and second write enable signals. The first and second memory circuits alternately have the data written to the first and second memory circuits read in response to the first and second read enable signals.

Other aspects and advantages of the present invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

Figure 4:
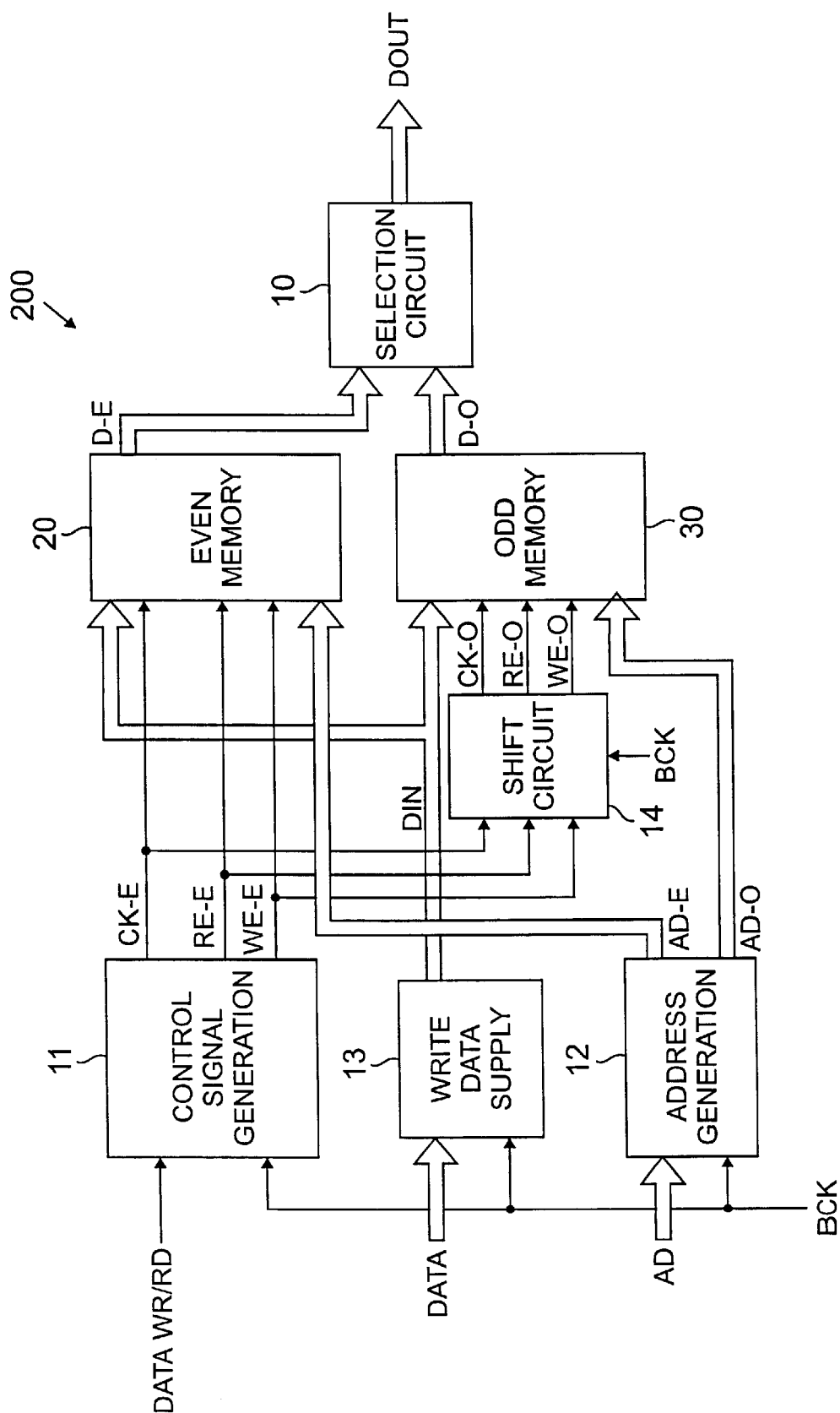
FIG. 4 is a schematic block diagram of a memory control circuit according to an embodiment of the present invention.

FIG. 4 is a schematic block diagram of a memory control circuit 200 according to an embodiment of the present invention.

A first (EVEN) memory circuit 20 and a second (ODD) memory circuit 30 each have a capacity enabling storage of at least ½ block of data on which a computation process is performed. The first and second memory circuits 20, 30 alternately store the write data DIN provided from the memory control circuit 200 and have the stored data alternately read. The first and second memory circuits 20, 30 are synchronous memories and have data written and read in accordance with a timing clock CK. The first and second memory circuits 20, 30 are connected to a selection circuit 15.

The memory control circuit 200 includes a control signal generation circuit 11, an address generation circuit 12, a write data supply circuit 13, and a shift circuit 14.

In response to a data write command or read command provided from a microprocessor (not shown), the control signal generation circuit 11 generates a first write enable signal WE-E, which permits a write operation to be performed in the first memory circuit 20, and a read enable signal RE-E, which permits a read operation to be performed in the first memory circuit 20. The control signal generation circuit 11 also generates a first timing clock CK-E for determining the operational timing of the first memory circuit 20.

The address generation circuit 12 receives an address AD provided from the microprocessor together with the data write/read command, and generates a first address AD-E for the first memory circuit 20 and a second address AD-O for the second memory circuit 30. The first and second addresses AD-E, AD-O are provided to the first and second memory circuits 20, 30, respectively. The write data supply circuit 13 sequentially receives data and holds the data. The held data is provided to the first and second memory circuits 20, 30 as the write data DIN.

The control signal generation circuit 11 generates the first write enable signal WE-E, the first read enable signal RE-E, and the first timing clock CK-E in accordance with a reference clock BCK. During the write operation, the write data supply circuit 13 provides the write data DIN to the first and second memory circuits 20, 30 in accordance with the reference clock BCK. The address generation circuit 12 provides the address AD as a write address in correspondence with the first write enable signal WE-E to the first and second memory circuits 20, 30. During the read operation, the address generation circuit 12 provides the address AD as a read address in correspondence with the first read enable signal RE-E to the first and second memory circuits 20, 30.

The shift circuit 14, for example, includes a plurality of D flip-flops arranged in parallel. The plurality of D flip-flops shift the first write enable signal WE-E, the first read enable signal RE-E, and the first timing clock CK-E by one cycle of the reference clock BCK (the cycle for writing and reading data) in accordance with the reference clock BCK, and generate a second write enable signal WE-O, a second read enable signal RE-O, and a second timing clock CK-O, each of which are provided to the second memory circuit 30.

The selection circuit 15 receives first and second read data D-E, D-O read from the first and second memory circuits 20, 30, respectively, and outputs read data DOUT by selecting either one of the first and second read data D-E, D-O in accordance with the reference clock BCK. The selection operation of the selection circuit 15 is performed in synchronism with the read operation of the first and second memory circuits 20, 30, or the first and second timing clocks CK-E, CK-O. For example, the selection circuit 15 selects the first read data D-E when the first timing clock CK-E is high and selects the second read data D-O when the second timing clock CK-O is high.

The memory control circuit 200 alternately writes consecutive data DIN to the first and second memory circuits 20, 30. Accordingly, write operation time corresponding to two cycles of the reference clock BCK are allocated to each of the first and second memory circuits 20, 30. Further, the read data DOUT is generated by synthesizing the first and second read data D-E, D-O read alternately from the selection circuit 15. Accordingly, read operation time corresponding to two cycles of the reference clock BCK are allocated to each of the first and second memory circuits 20, 30. Thus, the virtual access speed to the first and second memory circuits 20, 30 is about two times greater than the prior art.

Figure 5:
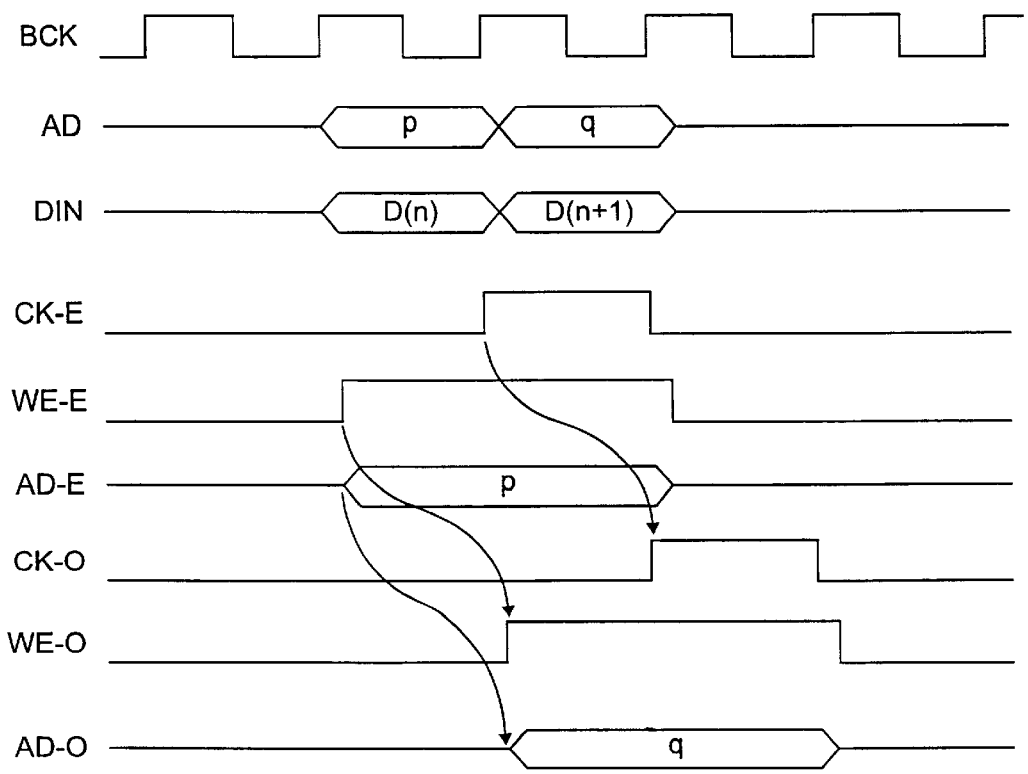
FIG. 5 is a timing chart illustrating the write operation of the memory control circuit of FIG. 4.

FIG. 5 is a timing chart illustrating the write operation of the memory control circuit 200 of FIG. 4. An example in which two consecutive data D(n), D(n+1) are written to the first and second memory circuits 20, 30 is shown in FIG. 5.

First, the write data D(n) is held by the write data supply circuit 13 in response to the reference clock BCK, and the write data D(n) is provided to the first memory circuit 20 for one cycle of the reference clock BCK. Synchronously with the input of the data D(n), the first write enable signal WE-E rises in response to the write command. Further, the first address AD-E, which designates the p address of the first memory 20, is generated. The activated state of the first write enable signal WE-E and the first address AD-E is maintained for two cycles of the reference clock BCK. After one cycle of the reference clock BCK elapses from when the first write enable signal WE-E rises, the first timing clock CK-E rises and the data D(n) is written to the p address of the first memory circuit 20. Since the data D(n) is delayed by the write data supply circuit 13, the data D(n) is properly stored in the first memory circuit 20 in response to the first timing clock CKE.

The second timing clock CK-O and the second write enable signal WE-O are generated by shifting the first timing clock CK-E and the first write enable signal WE-E by one cycle of the reference clock BCK. Thus, the second memory circuit 30 performs the write operation on the first memory circuit 20 delayed by one cycle of the reference clock BCK. At this time, the second address AD-O designates the q address of the second memory circuit 30, and the data DIN is provided to the second memory circuit 30 without passing through the shift circuit 14. Accordingly, the data D(n+1) following the data D(n) is stored at the q address of the second memory circuit 30 in response to the rising of the second timing clock CK-O.

Figure 6:
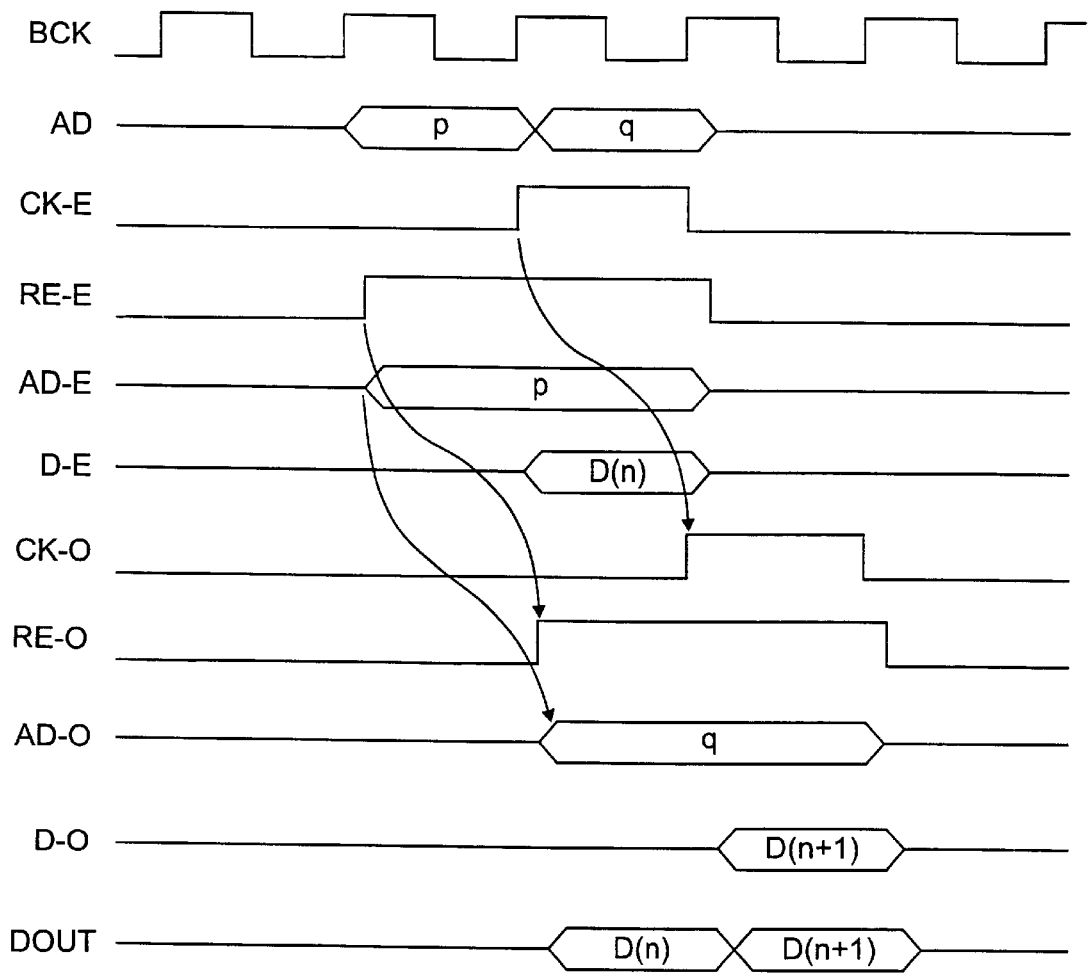
FIG. 6 is a timing chart illustrating the read operation of the memory control circuit of FIG. 4.

FIG. 6 is a timing chart illustrating the data read operation of the data stored in the first and second memory circuits 20, 30. An example in which the data D(n) stored at the p address of the first memory circuit 20 and the data D(n+1) stored at the q address of the second memory circuit 30 are consecutively read is shown in FIG. 6.

In accordance with the read command, the control signal generation circuit 11 causes the first read enable signal RE-E to go high in response to the rising of the reference clock BCK, and the address generation circuit 2 generates the first address AD-E designating the p address of the first memory circuit 20. The activated state of the first read enable signal RE-E and the first address AD-E are maintained for two cycles of the reference clock BCK. After one cycle of the reference clock BCK elapses from the rising of the first read enable signal RE-E, the first timing clock CK-E rises, and the data D(n) is read as the first read data D-E from the p address of the first memory circuit 20.

The second timing clock CK-O and the second read enable signal RE-O are generated by shifting the first timing clock CK-E and the first read enable signal RE-E by one cycle of the reference clock BCK. Accordingly, the second memory circuit 30 performs the read operation on the first memory circuit 20 delayed by one cycle of the reference clock BCK. The second address AD-O designates the q address of the second memory circuit 30. The data D(n+1) following the data D(n) is stored at the q address of the second memory circuit 30. Accordingly, the data D(n+1) is read from the second memory circuit 30 as the second read data D-O.

When the data D(n) is read from the first memory circuit 20, the selection circuit 15 selects the first read data D-E, or the data D(n), as the read data DOUT. When one cycle of the reference clock BCK elapses and the data D(n+1) is read from the second memory circuit 30, the selection circuit 15 selects the second read data D-O, or the data D(n+1), as the read data DOUT. The read data DOUT corresponds to the read data DOUT of FIG. 3.

Figure 1:
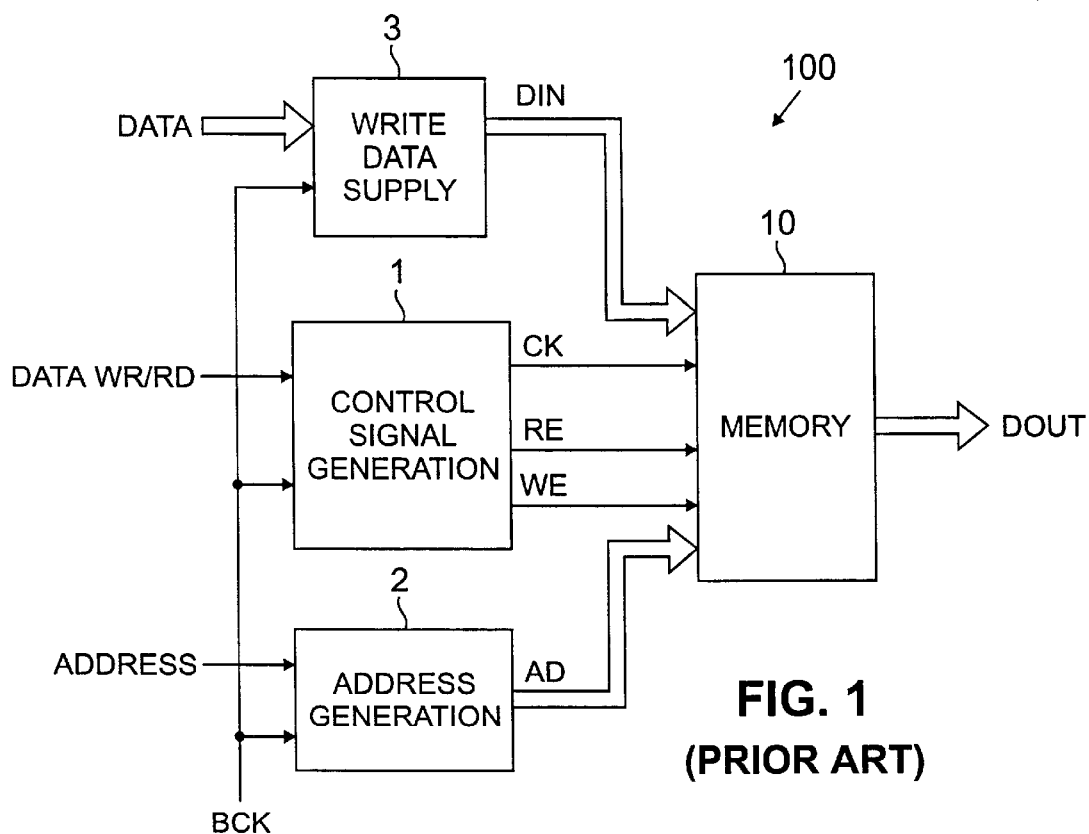
FIG. 1 is a schematic block diagram of a prior art memory control circuit.
Figure 2:
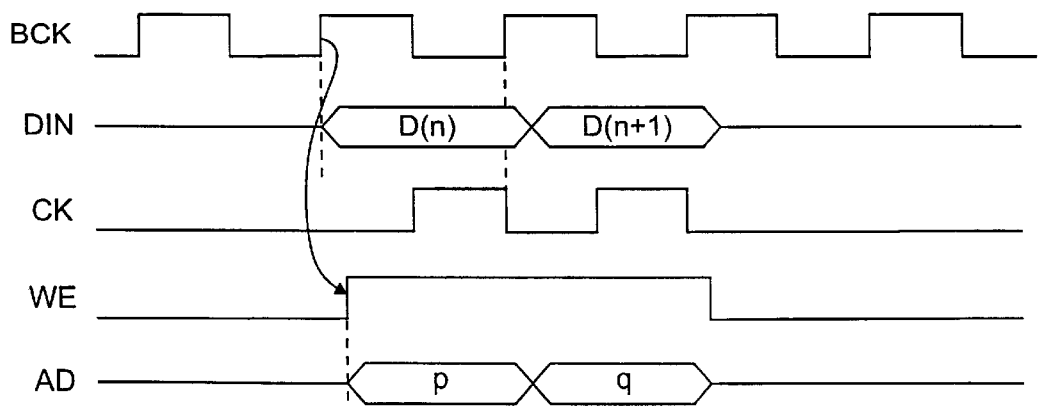
FIG. 2 is a timing chart illustrating the write operation of the memory control circuit of FIG. 1.
Figure 3:
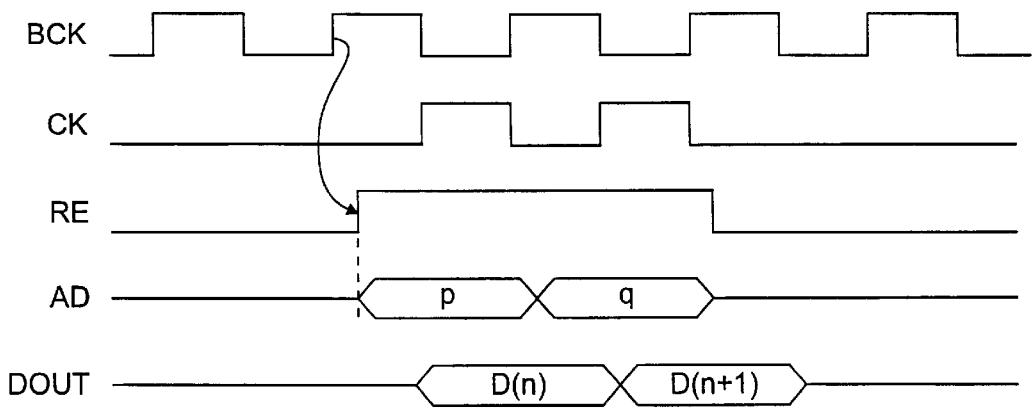
FIG. 3 is a timing chart illustrating the read operation of the memory control circuit of FIG. 1.

As described above, the memory control circuit 200 maintains the activated state of the first and second addresses AD-E, AD-O and the first and second write enable signals WE-E, WE-O or the first and second read enable signals RE-E, RE-O for two cycles of the reference clock BCK. Accordingly, two times the time of the write operation illustrated in FIG. 2 is provided for the write operation of the present embodiment. In the same manner, two times the time of the read operation illustrated in FIG. 3 is provided for the read operation of the present embodiment. In other words, access time equivalent to the write operation of FIG. 2 and the read operation of FIG. 3 is obtained even if the memory control circuit 200 of the present embodiment is operated by a second reference clock having a cycle that is one half a first reference clock which is the same as the prior art.

As described above, reading and writing is performed in the first and second memory circuits 20, 30 in a cycle that is two times the data input/output cycle. Accordingly, digital data may be written and read at a high speed without increasing the speed of access to the first and second memory circuits 20, 30.

Although only one embodiment of the present invention has been described herein, it should be apparent to those skilled in the art that the present invention may be embodied in many other specific forms without departing from the spirit or scope of the invention. Particularly, the present invention is not restricted to cases in which two data are consecutively written or read and may be applied to cases in which four or more data are written and read two at a time.

The present embodiment is to be considered as illustrative and not restrictive. The present invention is not to be limited to the details given herein, but may be modified within the scope and equivalence of the appended claims.

What is claimed is:

1. A memory control circuit for controlling writing and reading consecutive data to and from first and second memory circuits, comprising:

a control signal generation circuit connected to the first memory circuit for generating a first write enable signal and a first read enable signal of the first memory circuit;

an address generation circuit for generating an address signal designating a data write address of the first and second memory circuits;

a write data supply circuit for supplying write data to the first and second memory circuits; and a shift circuit connected between the control signal generation circuit and second memory circuit to generate a second write enable signal and a second read enable signal by shifting the first write enable signal and the first read enable signal by one cycle of a data write cycle or read cycle, wherein the write data is written alternately to the first and second memory circuits in accordance with an address signal and in response to the first and second write enable signals, and the data written to the first and second memory circuits is read alternately from the first and second memory circuits in response to the first and second read enable signals.

2. The memory control circuit according to claim 1, further comprising a selection circuit connected to the first and second memory circuits to selectively output the data read from the first and second memory circuits in synchronism with the shift operation of the shift circuit.

3. The memory control circuit according to claim 1, wherein the control signal generation circuit generates a first timing signal for determining the operational timing of the first memory circuit, and the shift circuit generates a second timing signal for determining the operational timing of the second memory circuit by shifting the first timing signal by one cycle of the data write cycle or read cycle.

4. A method for controlling writing and reading consecutive data to and from first and second memory circuits, comprising the steps of:

generating a first write enable signal and a first read enable signal of the first memory circuit;

generating an address signal which designates a data write address of the first and second memory circuits;

generating a second write enable signal and a second read enable signal by shifting the first write enable signal and the first read enable signal by one cycle of a data write cycle or read cycle;

alternately writing data to the first and second memory circuits in accordance with the address signal and in response to the first and second write enable signals; and alternately reading the data written to the first and second memory circuits from the first and second memory circuits in response to the first and second read enable signals.

5. The method according to claim 4, further comprising the step of receiving the read data from the first and second memory circuits and selectively outputting the read data in synchronism with the shifting of the first write enable signal and the first read enable signal.

6. The method according to claim 4, further comprising the steps of:

generating a first timing signal for determining the operational timing of the first memory circuit; and generating a second timing signal for determining the operational timing of the second memory circuit by shifting the first timing signal by one cycle of the data write cycle or read cycle.

* * * * *